United States Patent
Zheng et al.

(10) Patent No.: US 8,000,519 B1
(45) Date of Patent: Aug. 16, 2011

(54) METHOD OF METAL PATTERN INSPECTION VERIFICATION

(75) Inventors: Yongjun Zheng, Union City, CA (US); David Mark, San Jose, CA (US); Joe W. Zhao, San Jose, CA (US); Felino Encarnacion Pagaduan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1048 days.

(21) Appl. No.: 11/732,859

(22) Filed: Apr. 4, 2007

(51) Int. Cl.
*G06K 9/00* (2006.01)

(52) U.S. Cl. ........ 382/145; 382/100; 382/141; 382/147; 382/149; 438/10; 438/14; 438/16; 438/17; 324/500; 324/512; 324/523; 324/528; 324/537; 702/83

(58) Field of Classification Search ................... 382/141, 382/145–151, 100; 438/10, 14, 16, 17; 324/71.5, 324/500, 512, 522, 523, 527, 528, 531, 537; 702/81–84
See application file for complete search history.

(56) References Cited

U.S. PATENT DOCUMENTS

| | | | | |
|---|---|---|---|---|
| 4,357,540 A * | 11/1982 | Benjamin et al. | ........ | 250/491.1 |
| 5,777,901 A * | 7/1998 | Berezin et al. | ................ | 716/56 |
| 6,367,040 B1 * | 4/2002 | Ott et al. | ................ | 714/724 |
| 6,400,173 B1 * | 6/2002 | Shimizu et al. | ............... | 324/765 |
| 6,507,942 B1 * | 1/2003 | Calderone et al. | ............ | 716/16 |
| 6,741,940 B2 * | 5/2004 | Mugibayashi et al. | ........ | 702/84 |
| 6,889,368 B1 | 5/2005 | Mark et al. | | |
| 6,985,830 B2 * | 1/2006 | Lee et al. | ................ | 702/181 |
| 7,006,886 B1 * | 2/2006 | Huet et al. | ................ | 700/110 |
| 7,020,860 B1 * | 3/2006 | Zhao et al. | ................ | 716/5 |
| 7,145,344 B2 | 12/2006 | Mark et al. | | |
| 7,284,213 B2 * | 10/2007 | Fure et al. | ................ | 716/136 |
| 7,412,639 B2 * | 8/2008 | Volkerink et al. | ........... | 714/736 |
| 7,421,358 B2 * | 9/2008 | Tuohy | ................ | 702/81 |
| 7,453,261 B1 * | 11/2008 | Mark | ................ | 324/158.1 |
| 7,570,796 B2 * | 8/2009 | Zafar et al. | ................ | 382/144 |
| 7,760,929 B2 * | 7/2010 | Orbon et al. | ................ | 382/148 |
| 2004/0049722 A1 * | 3/2004 | Matsushita | ................ | 714/724 |
| 2004/0103354 A1 * | 5/2004 | Mark et al. | ................ | 714/725 |
| 2006/0171221 A1 * | 8/2006 | Mollat et al. | ................ | 365/201 |

OTHER PUBLICATIONS

Mark et al., "Localizing Open Interconnect Defects Using Targeted Routing n FPGA's", ITC International Test Conference, Paper 22.1, (2004) pp. 627-634; 0-7803-8580-2/04, IEEE.

* cited by examiner

*Primary Examiner* — Matthew Bella
*Assistant Examiner* — Eric Rush
(74) *Attorney, Agent, or Firm* — Scott Hewett; LeRoy D. Maunu

(57) ABSTRACT

A method of evaluating an inline inspection recipe compares the capture rate of metal pattern defects in bounding boxes arising from failed electrical test vectors to the capture rate after the bounding box is shifted. A difference between the first and second capture rates indicates whether the inline inspection recipe is valid for capturing killer defects, or if the inline inspection recipe needs to be adjusted. In a particular example, the electrical test vectors are directed at a selected patterned metal layer of an FPGA (M6), and the metal pattern defect data for the selected patterned metal layer is mapped to the bounding box determined by the electrical test vector.

19 Claims, 5 Drawing Sheets

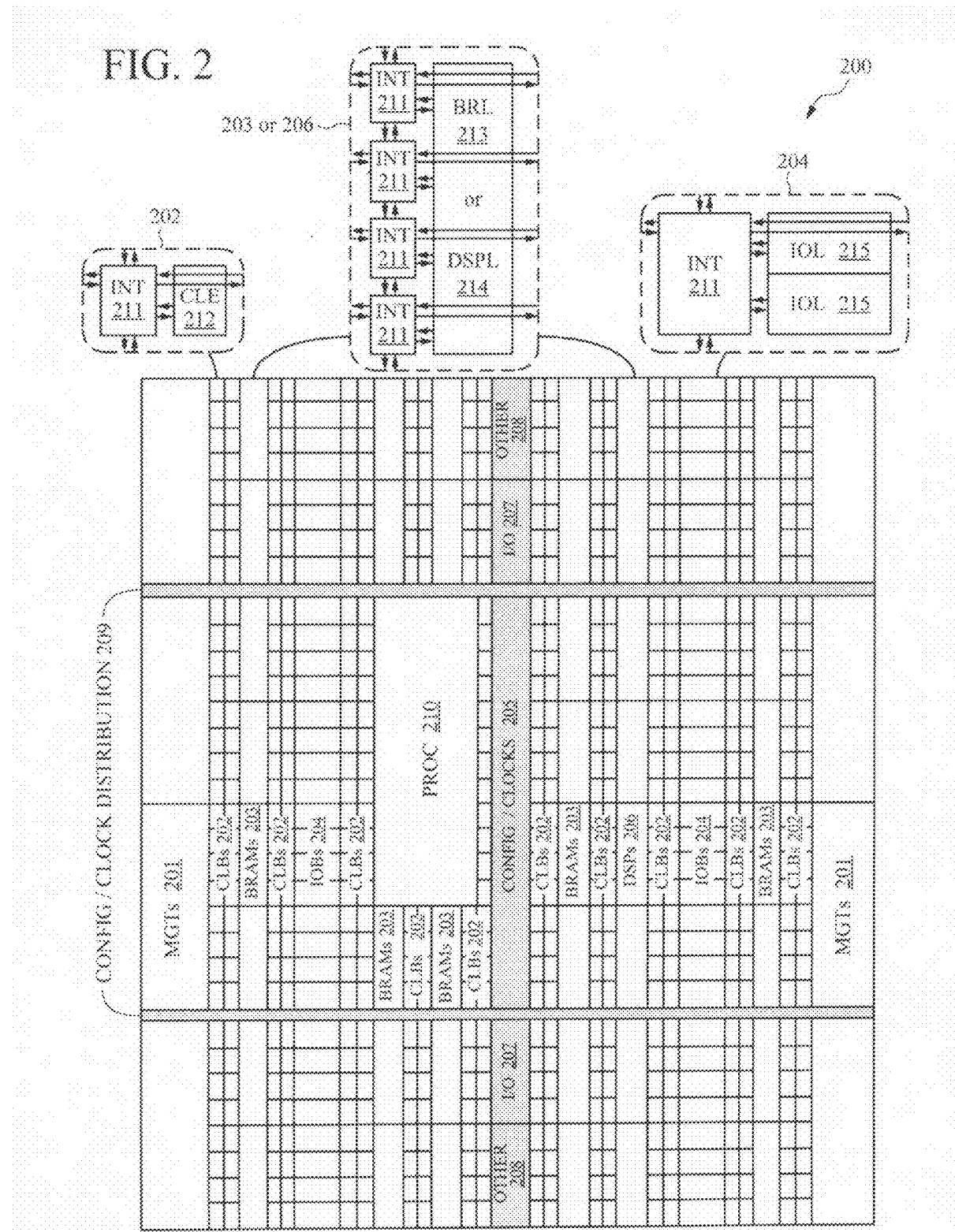

METHOD OF METAL PATTERN INSPECTION VERIFICATION

FIELD OF THE INVENTION

The present invention relates generally to semiconductor devices, and more particularly to inline inspection of metal layers in integrated circuits.

BACKGROUND OF THE INVENTION

Integrated circuits ("ICs") use various sorts of devices (e.g., FETs, resistors, and diodes) to create logic and other types of circuits. The devices of an IC are connected to each other and to the terminals of the IC using patterned metal layers. As device dimensions shrink and ICs become more complex, wiring structures in ICs have become more challenging. In complex ICs, such as microprocessors, memory devices, and programmable logic devices, more than six patterned metals might be used in an IC.

Patterned metal layers are fabricated using any of several techniques, such as damascene, dual damascene, or patterned thin film techniques. Contacts and vias are used to connect one patterned metal layer to another, and to connect circuit elements in patterned metal layers to the semiconductor devices.

It is common in the art of IC processing to refer to the fabrication steps used in processing the semiconductors as front-end-of line ("FEOL") processes, and to the fabrication steps used in processing the patterned metal layers and intervening layers of dielectric material(s) as back-end-of line ("BEOL") processes.

"Inline" testing is done as a wafer or run of wafers is being processed, and inline techniques have been developed to evaluate both FEOL and BEOL processing. Inline testing and evaluation techniques provide a manufacturer with information regarding the quality of the wafers being fabricated, and whether the manufacturing processes are providing the desired results.

Basically, an optical or E-beam image of a portion of the IC or wafer is evaluated against a standard image or expected patterns. Differences between the test image and standard image are logged, and in some cases, used to adjust the process parameters of one or more fabrication steps. The inspection is typically repeated across the IC and for other ICs on the fabrication wafer.

Inline testing is important when fabricating devices with many patterned metal layers, because an electrical failure of the device could occur from a defect in any one of the patterned metal layers. A metal layer defect that causes an electrical failure is called a "killer defect". A killer defect in a BEOL patterned metal layer often arises from particulate contamination (dust), but can arise from other sources, such as broken traces. Other types of defects might be observed during inline inspection, such as minor scratches, thick traces, thin traces, or uneven traces, or particulate contamination that does not cause a killer defect. Non-killer metal pattern defects provide desirable feedback to the fabrication line, which might use the information to adjust the parameters of a metal deposition, etch, or polish operation, for example. If defective patterned metal layers are being produced, it is desirable to detect and resolve the defects quickly to avoid yield loss.

However, an electrical failure in a finished or essentially finished IC might not be clearly associated with a defect identified in a metal pattern inspection. An overly sensitive inspection might capture differences between the images, or even noise, that do not cause an electrical failure.

Conventional techniques used to correlate metal pattern defects with electrical defects for complex ICs, such as FPGAs, rely on physical failure analysis ("PFA"), which is time consuming and typically occurs after the IC has been fabricated. Also, PFA might identify many apparent defects in a region of the IC, but the operator might not know which apparent defect caused the electrical failure.

In some instances, a bounding box associated with an electrical test vector is used to determine approximately where on the IC the killer defect occurred. This helps to focus the PFA on a smaller area. A test vector applied during electrical test is intended to produce an expected output. If the electrical test output is not the expected value, an area of the IC in which the killer defect is highly likely to have occurred (i.e., the bounding box) can be determined. The resultant bounding box depends on the test vector and type of IC being tested, and possibly on the result obtained from electrical test.

If the PFA can correctly identify the killer defect, parameters of the inline inspection process, such as sensitivity, pixel (defect) size, and filtering (defect shape), can be adjusted to improve correlation between the metal pattern defects and electrical failures. Unfortunately, even if the bounding box is relatively small, PFA is a time-consuming effort that often requires highly skilled technicians.

Techniques for correlating metal pattern defects captured during inline inspection with electrical failures that avoid the disadvantages of the prior art are desirable.

SUMMARY OF THE INVENTION

A method of evaluating an inline inspection recipe compares the capture rate of metal pattern defects in bounding boxes arising from failed electrical test vectors to the capture rate after the bounding box is shifted. A difference between the first and second capture rates may indicate whether the inline inspection recipe is valid for capturing killer defects, or if the inline inspection recipe needs to be adjusted. In a particular example, the electrical test vectors are directed at a selected patterned metal layer of an FPGA, and the metal pattern defect data for the selected patterned metal layer is mapped to the bounding box determined by the electrical test vector.

BRIEF DESCRIPTION OF THE DRAWINGS

FIG. 2 is a plan view of an FPGA tested according to an embodiment.

DETAILED DESCRIPTION OF THE DRAWINGS

Figure 1:
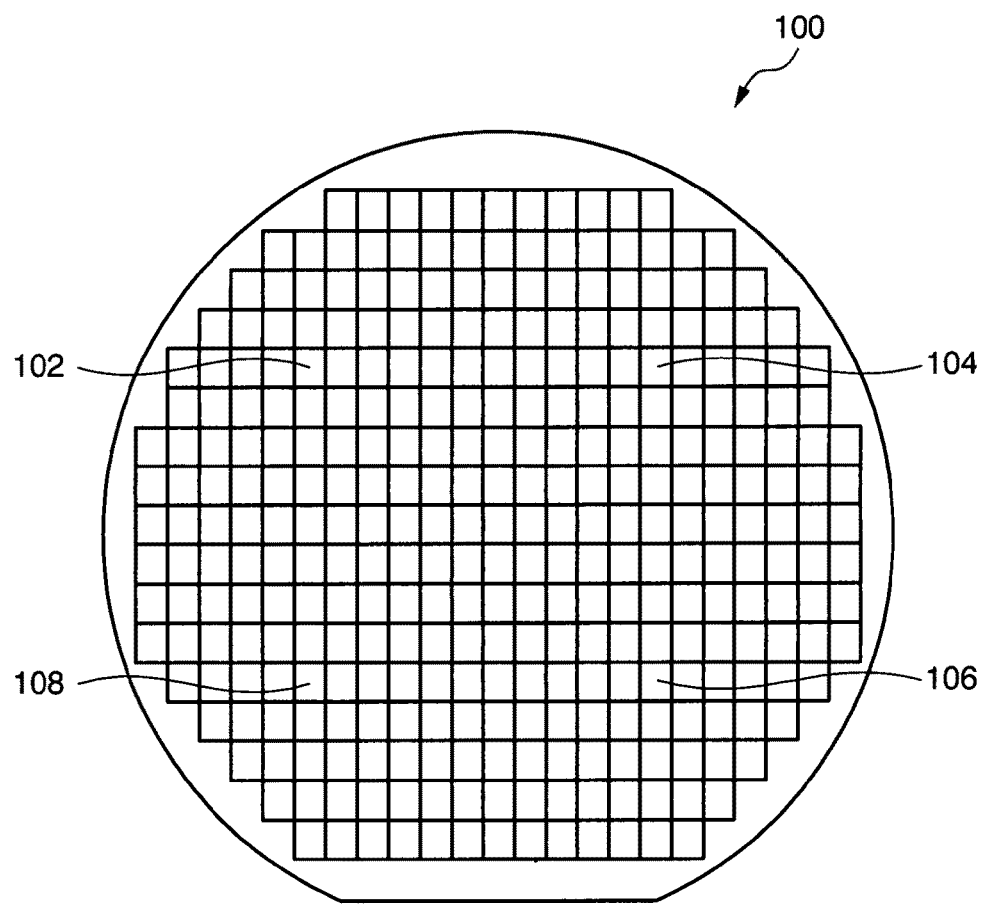
FIG. 1 is a diagram of an exemplary wafer tested according to an embodiment.

FIG. 1 is a diagram of an exemplary wafer 100 tested according to an embodiment. The wafer 100 has been fabricated through a front-end of line sequence to define what will become ICs 102, 104, 106, 108. A wafer can have many different types of ICs, or the ICs can all be of one type. In a particular embodiment, all the ICs on the wafer are essentially identical FPGAs. At least one patterned metal layer has been defined (fabricated) on the ICs. The patterned metal layer is a plug layer, a damascene layer, a dual damascene layer, or a patterned thin-film layer, for example. Such patterned metal layers are familiar to those of skill in the art of IC fabrication.

The patterned metal layer of at least a portion of at least one IC is inspected using an inline inspection technique. This inline inspection is typically performed using an optical, E-beam, or combined system. Generally, defects captured during inline inspection are correlated to die coordinates and the locations of the defects are stored in an inspection file (see FIG. 4). Although embodiments including inspection of a single patterned metal layer are useful, inspection and defect capture for multiple metal layers is typically performed, with inspection defect data being stored for each of the patterned metal layers.

Figure 3A:
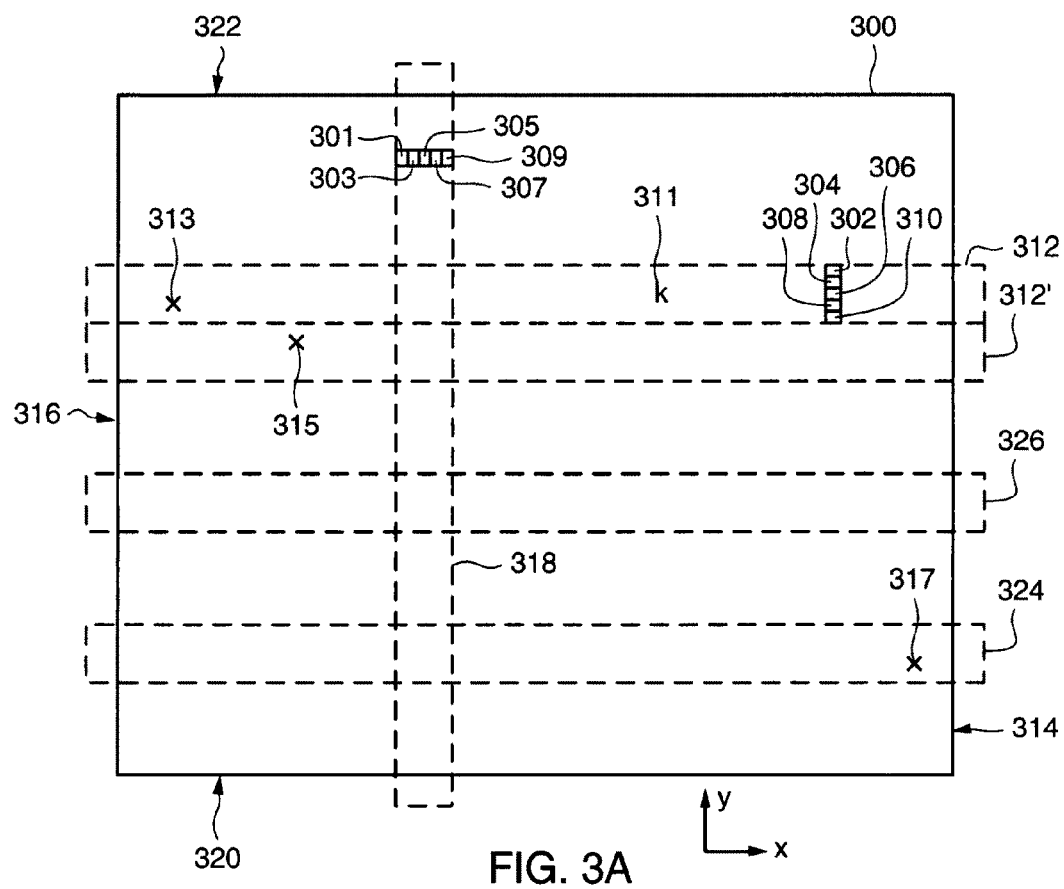
FIG. 3A is a plan view of bounding boxes on an FPGA according to an embodiment.
Figure 3B:
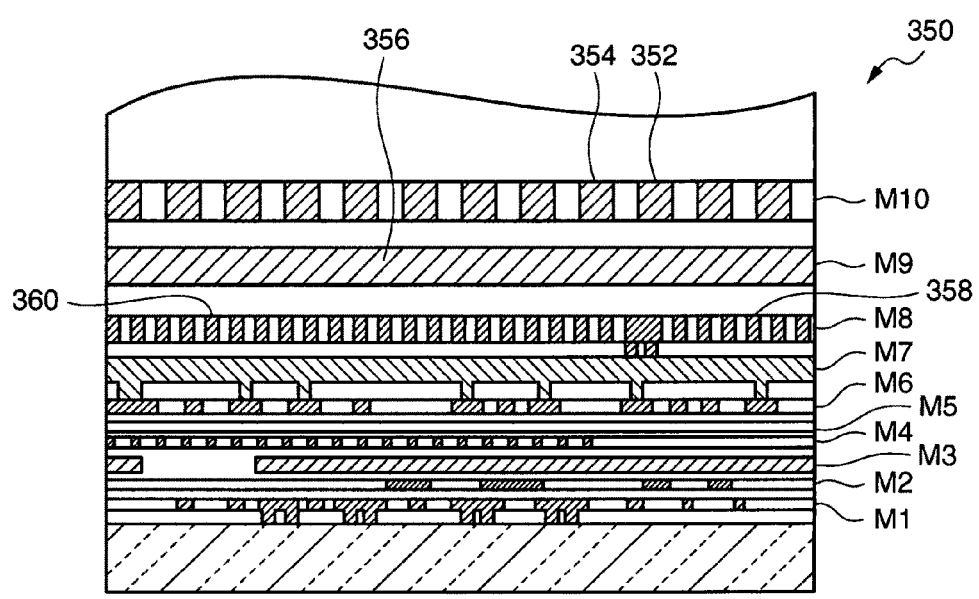
FIG. 3B is a cross section of an IC illustrating multiple metal layers tested according to an embodiment.

Metal layers are numbered from the substrate to the upper surface of the IC (see FIG. 3B). For example, in an FPGA having eleven metal layers, the M1 layer is nearest the semiconductor wafer, and the M11 layer is near the upper surface of the IC. Layer-specific test patterns can be generated for specific metal layers. For example, in an FPGA having six to eleven metal layers, a test vector is created that routes interconnects through the fourth metal layer ("M4"). An electrical test failure typically indicates that an interconnect in the M4 layer has an open or a short defect.

A bounding box is determined according to the test vector. The bounding box basically indicates the physical area on the FPGA that the electrical test failure is likely to have occurred in. In a particular embodiment, production test vectors, which are test vectors intended to efficiently test the electrical operation of the IC, are used to capture the electrical failure data. The bounding box(s) associated with production test vectors can be relatively large; however, embodiments of the invention provide quick verification of the validity of the inline inspection process using production test vectors. Alternatively, specialized test vectors ("localization test vectors") optimized to associate an electrical failure with a smaller bounding box on the IC are used; however, localization test vectors require additional test development and consume more test time when run in conjunction with production test vectors.

In one embodiment, the width or height of a bounding box derived from a test vector of an FPGA is greater than or equal in size to a configurable logic block ("CLB") of the FPGA. The bounding box is this size because the test vector cannot determine the physical location of the defect causing the electrical test failure to an area smaller than a CLB. In another embodiment, the bounding box is at least three CLBs high or 3 CLBs wide (see FIG. 3A) and extends from one edge of the FPGA to the opposite edge. The traces in the upper metal layers (e.g., above M4) often extend for long runs parallel to an edge of the IC. Some traces might extend essentially from one edge of the IC to the other, which is why a bounding box for such a metal layer extends from one edge of the IC to the other, while the orthogonal dimension of the bounding box is at least one CLB high or wide in an FGPA. In a particular embodiment, the bounding box is not more than 5 CLBs high or 5 CLBs wide. The particular size of a bounding box depends on the test vector being used, and bounding boxes may be arbitrarily large. For example, the entire IC may be defined as the bounding box, which means that the killer defect causing the electrical failure identified by the test vector occurred somewhere within the IC. However, smaller bounding boxes are desirable to limit the killer defect to a smaller physical area on the IC.

In an FPGA, several bounding boxes having a height or width of five CLBs and extending across the width or height of the IC can be defined. This allows the bounding boxes to be offset as described in association with FIGS. 3A and 4 to verify the inline inspection recipe. It is desirable to determine whether the inspection process step is correctly identifying defects that cause electrical failures.

Techniques for developing test patterns and test vectors for specific metal layers in an FPGA are discussed in U.S. Pat. No. 7,145,344 to Mark et al., filed Nov. 7, 2003 and issued on Dec. 5, 2006, which is a continuation-in-part of U.S. Pat. No. 6,889,368 to Mark et al. filed on Oct. 25, 2002 and issued on May 3, 2005, both of which patents are hereby incorporated by reference in their entirety for all purposes.

FIG. 2 is a plan view of an FPGA 200 tested according to an embodiment. The FPGA may include CMOS portions in several of the functional blocks, such as in RAM and logic, and may be fabricated using a CMOS fabrication process. Silicon-based gate oxide layers according to one or more embodiments of the invention are incorporated in any of several functional blocks, such as a memory block, logic block, I/O block, clock circuit, transceiver, or other functional block; within many functional blocks; or within a physical section or segment of the FPGA 200.

The FPGA 200 has at least six patterned metal layers. In a particular embodiment, the FPGA has eleven patterned metal layers. An inline inspection of a patterned metal layer may be performed to capture metal pattern defects, and then a test vector may be used to electrically test the FPGA 200 after it is substantially complete. In a particular embodiment, the test vector may be applied to the FPGA before being singulated from a wafer, i.e., during wafer test. A bounding box in accordance with the test vector may be defined, and a first capture rate of killer defects within the bounding box may be determined. Then, the bounding box may be offset, and a second capture rate of the killer defects may be determined and compared to the first capture rate to evaluate the inline inspection process.

The FPGA architecture includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215. In the pictured embodiment, a columnar area near the center of the die (shown shaded in FIG. 2) is used for configuration, clock, and other control logic.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

FIG. 3A is a plan view of bounding boxes on an FPGA 300 according to an embodiment. The FPGA 300 has several CLBs 302, 304, 306, 308, 310, 301, 303, 305, 307, 309, 311. The FPGA has many other CLBs that are not separately shown for clarity of illustration. A first bounding box 312 is five CLBs tall and extends from a first edge 314 of the FPGA 300 to a second edge 316 of the FPGA 300 that is opposite the first edge 314 of the rectangular FPGA 300, as is defined according to a production test vector. The bounding boxes are shown as extending beyond the edges of the FPGA for simplicity of illustration and discussion. Those of skill in the art appreciate that killer defects do not occur in the extended regions, and that these regions do not affect the analysis.

A second bounding box 318 is five CLBs wide and extends from a third edge 320 to a fourth edge 322 that is opposite the third edge 320. For FPGA metal pattern failures, defect locations can be estimated to be within a bounding box that is 5 CLBs tall or wide across the whole chip. The terms "tall" and "wide" are used merely for purposes of convenient discussion in relation to the view orientation of FIG. 3A.

Some traces in the patterned metal layer, such as VHEX lines, might extend a considerable distance across the IC (e.g., across five CLBs). Long traces are more common in the upper metal layers (e.g., M6-M11) of an FPGA than in the lower metal layers (e.g., M1-M5). Thus, bounding boxes extending across the IC are particularly desirable in metal layers above the M5 layer in an FPGA. Similarly, production test vectors often use inputs along one edge of the IC, and outputs along the opposite edge of the IC. Bounding boxes extending from one edge of the IC to the opposite edge of the IC are particularly desirable when using production test vectors.

In a particular embodiment, the height of the bounding box 312 is about 500 microns according to the test vector used. Alternative test vectors would produce bounding boxes that are larger or smaller. The test vector identifies an electrical failure occurring somewhere within the bounding box 312. Metal pattern defects 311, 313 captured during inline inspection are matched to the area described by the bounding box 312. Other metal pattern defects 315, 317 are matched to other bounding boxes 312', 324.

At least one of the metal pattern defects 311 is a killer defect (shown as a "k"). In a particular embodiment, the test vector is designed to utilize a particular metal layer ($M_N$), and the metal pattern defects mapped into the bounding box are from the $M_N$ layer inline inspection data. The killer defect 311 occurs in the $M_N$ layer.

Only one killer defect is needed within the bounding box to cause an electrical failure, although the metal pattern defect identified within a bounding box might not have caused the electrical failure. In some cases, multiple defects (e.g., 311, 313) occur in a bounding box 312, and it is not readily apparent which defect, if any, caused the electrical failure. In other instances, an electrical failure might have occurred in a bounding box that has no associated metal pattern defect(s), or metal pattern defects occur in bounding boxes that do not have an electrical failure.

Killer defects are usually caused by random particulate contamination or similar causes, and are relatively rare in modern fabrication facilities producing acceptable yields. ICs that fail electrical test usually do not have more than one or two killer defects per metal layer. However, inline inspection might capture many more metal pattern defects. For example, a scratch might be captured as a series of metal pattern defects, but not cause an electrical failure. The inline inspection recipe can be adjusted to filter out scratches, and other parameters of the inline inspection recipe, such as sensitivity or pixel size, can be adjusted to capture killer defects without capturing an undue number of metal pattern discrepancies that do not cause an electrical failure.

"Capture rate" is used to evaluate whether the inline inspection techniques are capturing the killer defects. In a typical die, an inline inspection might capture 100 metal pattern defects, only one or two of which are killer defects. Capture rate is the percentage (or alternative numerical representation) of the number of electrical failures that can be matched to a metal pattern defect in a particular metal layer. For example, if one hundred dies in a wafer lot fail electrical test for a metal layer, and metal pattern defects in the metal layer can be matched to bounding boxes on sixty of the dies, than there is a 60% capture rate of killer defects at inline inspection.

Increasing the size of a bounding box generally increases the capture rate, but degrades localization of the defect. For example, if the entire die is considered to be a bounding box, and if each die that fails electrical test has at least one metal pattern defect, than a capture rate of 100% is obtained. In the extreme, all dice might have at least one metal pattern defect in a metal layer, so that any electrical failure for the metal layer would add to the capture rate, producing a capture rate of 100%. However, this information might not be particularly helpful. For example, if the inline inspection recipe is overly sensitive, it will catch a lot of non-killer defects as well as the killer defects, or catch a lot of non-killer defects and miss at least some of the killer defects. Thus, the capture rate alone does not ensure a valid inline inspection recipe. Non-killer metal pattern defects may be thought of as noise for purposes of determining the capture rate. While it would be desirable to provide an inline inspection that captured only the killer defects, some amount of non-killer defects are also captured in typical applications.

Thus, capture rate does not provide a complete indication of the validity of the inline inspection recipe. If capture rate is low (generally less than 40%), a fabrication vendor will often adjust the inline inspection recipe because a low capture rate indicates that the killer defects are not being identified (captured) at inline inspection. The fabrication vendor typically adjusts the inline inspection recipe to provide a capture rate of at least 40%; however, merely increasing the capture rate by adjusting the inline inspection recipe does not ensure a valid inline inspection process.

Some bounding boxes, such as bounding box 326, do not have a metal pattern defect. If an electrical failure occurred within bounding box 326, the capture rate would be zero because there is no metal pattern defect to correlate to the electrical failure. If no electrical failure occurred within bounding box 326, then it is not used in calculating the capture rate.

Bounding box 318 illustrates that test vectors may be applied across the top 322 or bottom 320 of the die 300. Other types of test vectors are alternatively applied, and other types of bounding boxes are alternatively defined.

According to an embodiment of the invention, the bounding box 312 (which is about 500 microns high) is offset about 500 microns to produce an offset bounding box 312'. Another metal pattern defect 315 occurs in the offset bounding box 312', so the capture value for the test vector that defined bounding box 312 does not change (i.e., remains a one value), even though the metal pattern defect 315 is not a killer defect.

A similar offset bounding box could be drawn above bounding box 312, but is omitted for simplicity of illustration. It is seen that this offset bounding box would not include a metal pattern defect, which would invert the capture value (i.e., the capture value would change to zero). Offsetting the bounding box along an axis (e.g., the y-axis) by a dimension of the bounding box along that axis provides information on the validity of the inline inspection process. If the inline inspection process captured only killer defects, and there are only a few (typically 1-2) killer defects per die, than an offset bounding box would be highly likely to have the inverse capture value from the original bounding box in which the electrical failure occurred.

For example, if the inline inspection process captured only the killer defect 311, and did not capture the non-killer metal pattern defect 315 (or defects 313, 317), then the offset bounding box 312' would not have a metal pattern defect in its area, and the capture value would be zero. As mentioned above, some number of non-killer defects (e.g., metal pattern defect 315 in offset bounding box 312') are typically captured in practical inline inspections. This can add to the apparent capture rate for the offset bounding box(es). Similarly, if an IC-die had a second killer defect in the offset bounding box (e.g., metal pattern defect 315 were a killer defect), this would also add to the capture rate.

The comparison between the capture rate for the bounding box 312 defined by the test vector and the offset bounding box 312', when performed on a statistically significant number of die, can provide an indication of the quality of the inline inspection process. A run of wafers often produces a statistically significant sample size of ICs having electrical failures; however, multiple runs of wafers can be grouped to provide a statistically significant sample size of electrical failures. In a particular example, runs of wafers or multiple runs of wafers produced between 100 and 300 dies having electrical failures, which were used to calculate capture rate and determine inline inspection quality. It is possible that a single die may have more than one electrical failure, or that both the electrical failure and the physical defect occur in more than just one metal layer.

FIG. 3B is a cross section of a portion of an IC 350 illustrating multiple metal layers suitable for an embodiment. The IC 350 is an FPGA having more than five patterned metal layers. As is familiar to those of skill in the art of BEOL design, the dominant direction of the traces in one metal layer is frequently orthogonal to the dominant direction of the traces in the metal layers above and below. Thus, the traces 352, 354 in M10 are viewed on-end, while the section of trace 356 in M9 is viewed along its length. Similarly, the traces 358, 360 in M8 are viewed on end. The areas between the traces are dielectric material(s), as is well known in the art of BEOL processing.

In an embodiment, a test vector is applied to at least one of the metal layers M6 or greater, and a bounding box for that test vector in that metal layer is defined. Metal pattern defect data from inline inspection of that metal layer is correlated to calculate a first capture rate, and then the bounding box is offset along an axis by the dimension of the bounding box on that axis and an offset capture rate is calculated. The offset capture rate is compared to the first capture rate to determine the quality of the inline inspection recipe. Alternatively, the bounding box is offset less than or more than the dimension of the bounding box along the offset axis.

Figure 4:
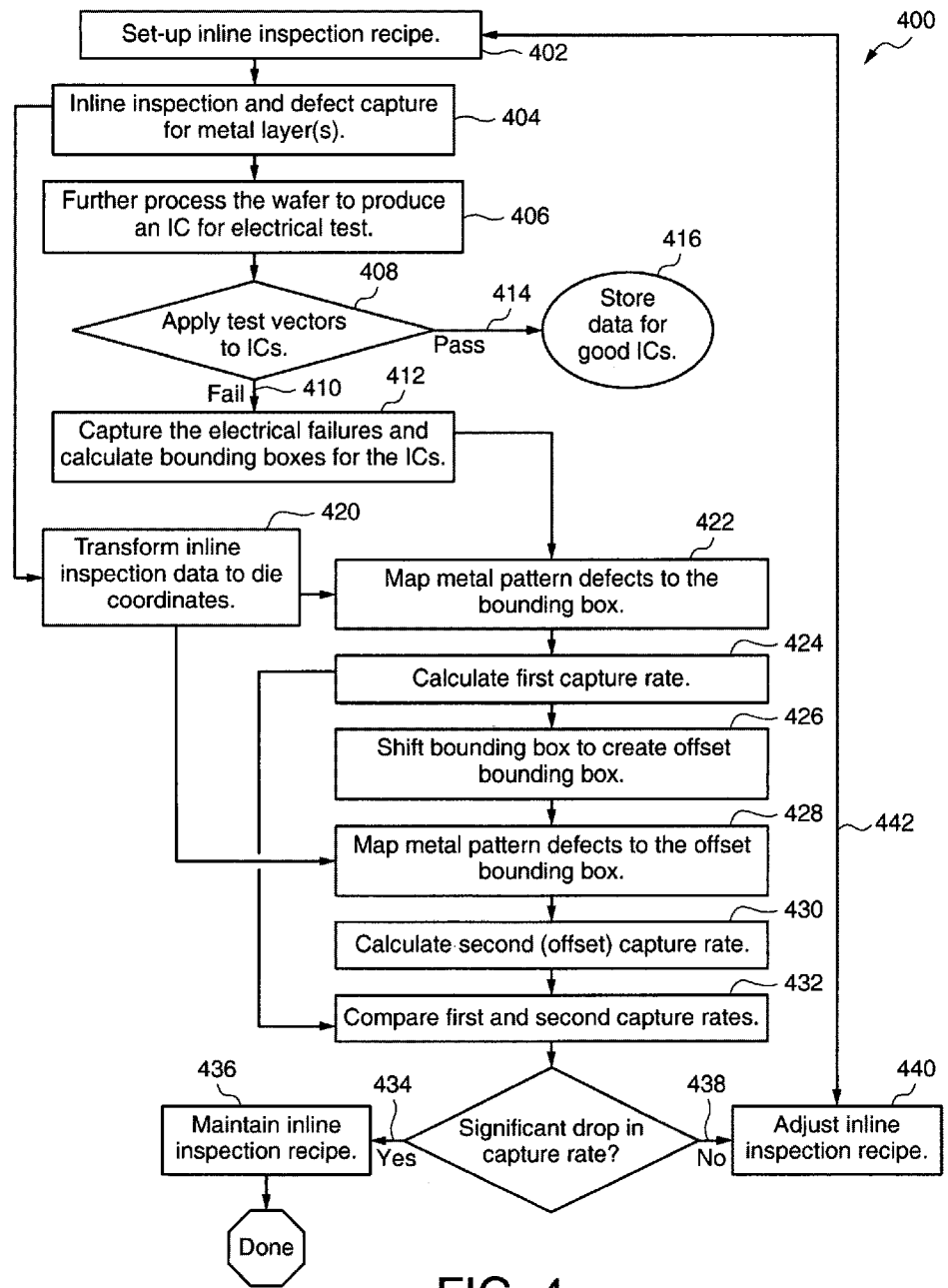
FIG. 4 is a flow chart of a test process according to an embodiment.

FIG. 4 is a flow chart of a method of evaluating an inline inspection recipe 400 according to an embodiment. An inline inspection process is set-up according to an inline inspection recipe (step 402). The inline inspection recipe defines the parameters of the inspection process, such as pixel size and shape filtering, and such recipes are well known in the art of inline wafer inspection. Inline inspection of a patterned metal layer of a statistically significant number of ICs is performed, and the inspection defect data is stored in a data file (step 404). Generally, enough ICs are inspected to provide a statistically significant number of samples for calculating capture rate. If the fabrication quality is very high, the data from several runs of wafers might be accumulated to provide the desired sample size, which depends on the subsequent electrical test results.

Frequently, inline inspection of each metal layer is performed as the wafer is being fabricated, and different inline inspection recipes are used for the different metal layers. In a particular embodiment, as the wafer is further processed, additional inline inspections are performed for the subsequent metal layers, and the metal pattern defect data for each metal layer is captured (stored in a data file); however, metal defect data for a single metal layer is used in some embodiments. The inspection and processing steps for these subsequent metal layers are omitted for simplicity and clarity of illustration, and are familiar to those of skill in the art of BEOL processing.

The wafer(s) is further processed to a condition suitable for performing electrical tests on the ICs (step 406). Typically, the electrical test is performed as a wafer test; however, electrical test is performed on singulated or even packaged devices in alternative embodiments. A test vector is applied to the ICs (step 408). If an IC fails electrical test (branch 410) the electrical failures are captured and a bounding box is calculated according to the test vector (step 412). If an IC passes electrical test (branch 414), the electrical test data is not used in calculating the capture rate, and the pass data for those ICs is stored (step 416). In an exemplary application, the wafer processing continues according to the standard production flow.

In a particular embodiment, the test vector is designed to detect electrical failures in a selected metal layer (namely, the metal layer inspected in step 404). Typically, the same test vector is applied several times or several test vectors are applied to an IC to test several different physical areas and electrical functions of the IC, as well as performing electrical tests directed at several of the metal layers; however, only a single test vector is applied to several ICs in some embodiments.

In a particular embodiment, the test vector is designed to capture electrical failures in a selected metal layer of the IC. In a more particular embodiment, the selected metal layer is an M6 or higher metal layer. In another embodiment, the test vector is a production test vector.

The bounding boxes are calculated for the electrical failures according to the test vector(s) used to test the ICs. A bounding box defines a physical area of the IC (die) in which the electrical failure is expected to have occurred. If a test vector designed to detect failures in a selected metal layer is used, then both the layer and general area of the killer defect is known. Although bounding boxes may be made arbitrarily large (e.g., the entire chip may be defined as a bounding box). It is generally desirable to use as small a bounding box as practical to limit the number of electrical defects arising within the bounding box, which reduces the number of metal pattern defects that might have caused the electrical failure.

In an embodiment, a bounding box of an FPGA is not more than five CLBs high, and the bounding box extends from one edge of the FPGA to the opposite edge of the FPGA. Several test vectors are used to test different portions of the FPGA, and associated bounding boxes are determined if an electrical failure occurs for that IC. The bounding box for one test vector optionally partially overlaps the bounding box for a second test vector.

The inline inspection data from step 404 is typically stored referenced to an inline inspection origin. The inline inspection data is transformed to die coordinates (step 420), which allows the metal pattern defects to be mapped to the bounding boxes (step 422). A first capture rate is calculated for the bounding box (step 424) from a statistically significant sample of ICs having electrical failures. In a particular embodiment, data from at least one hundred ICs having electrical failures are used to calculate the first capture rate.

If the inline inspection recipe is valid, a reasonably high capture rate is expected. In other words, one would expect to have captured at least one defect (i.e., the killer defect) during inline inspection that falls into the subsequent bounding box. As described above in reference to FIG. 3A, many defects might fall within the bounding box, and one, some, or none of the defects might be the killer defect that caused the electrical failure. It is desirable to ensure that the inline inspection recipe is capturing the killer defects. If defects are not mapped within the bounding box, a low capture rate results.

Typically, if the capture rate is below 40%, the inline inspection process is adjusted by the fabrication area until a higher capture rate is obtained on subsequent wafers. However, merely increasing the capture rate does not necessarily mean that the killer defects are being reliably identified at inline inspection. For example, if the sensitivity of the inline inspection process were increased so that many more metal pattern defects were captured, many or even most of which do not cause a killer defect, the capture rate would rise because there would be a greater likelihood that a bounding box includes a metal pattern defect (see, FIG. 5 and associated description). Shifting the bounding boxes and recalculating the capture rate validates the inline inspection recipe.

The process, which is applied to a statistically significant sample size, will be described for an individual IC. The area (footprint) defined by the bounding box is shifted a selected amount (step 426) to produce an offset bounding box, and metal pattern defect data for the area of the die defined by the offset bounding box is mapped to the offset bounding box (step 428). A second capture rate (offset capture rate) is calculated for the offset bounding boxes (step 430).

If metal pattern defects tend to arise in the offset bounding boxes, the capture rate will remain at or near its previous level. If no metal pattern defect arises in the offset bounding box, the offset capture rate will be significantly less than the first capture rate. If a large number of non-killer defects are captured in the inline inspection process, the capture rate for the offset bounding boxes will remain high, but not validate that these are killer defects. If the capture rate for the offset bounding boxes is significantly less than the capture rate for the original bounding boxes, then the inline inspection process is validated as capturing killer defects.

The first capture rate is compared to the second capture rate (step 432). If there is a sufficient difference (typically a drop) in the capture rate (branch 434), the inline inspection recipe is maintained (step 436). If the difference in capture rates is not sufficient (branch 438), the inline inspection recipe is adjusted (step 440). That is, the comparison between the first and second capture rates is used to indicate that the inline inspection should be adjusted to improve identification of killer defects. Inline inspection engineers are familiar with the parameters of inline inspection processes, such as pixel size and filtering (defect shape(s)), to improve capturing killer defects. The process is repeated (branch 442) on a subsequent run of wafers with the adjusted inline inspection recipe. If the adjustment was correct, then a sufficient drop in capture rate (see branch 434) should be seen. If not, the inline inspection recipe is again adjusted (step 440 and branch 442).

Figure 5:
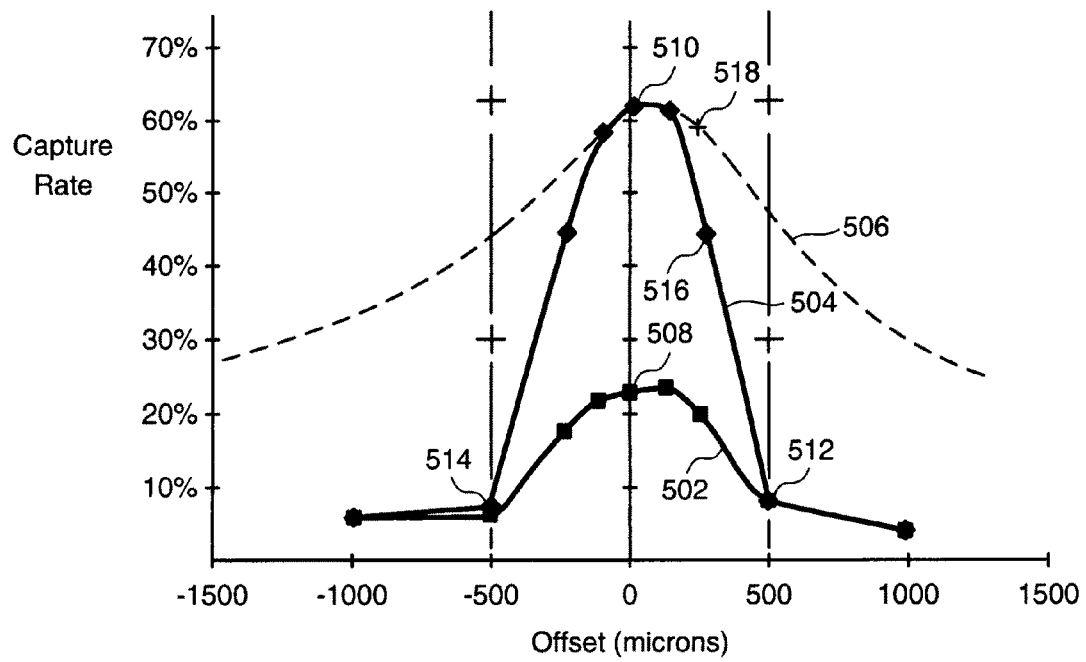
FIG. 5 is a graph illustrating accuracy verification of an inspection process of an embodiment.

FIG. 5 is a graph 500 illustrating accuracy verification of an inspection process of an embodiment. Plots 502, 504 show the actual capture rate (y-axis) verses offset of a bounding box (x-axis in microns), and plot 506 shows expected sensitivity of capture rate to offset for a noisy inline inspection process. The samples for plots 502 and 504 were FPGAs and the test vectors were applied at wafer test. Production test vectors were used, and the bounding boxes defined by the production test vectors extended across the FPGAs and were about five CLBs high. A smaller bonding box could have been defined for the production test vector (e.g., a bounding box about three CLBs high); however the bounding boxes used were sufficiently small to use with the metal pattern defect density presented in the samples.

Plot 502 represents the capture rate versus offset of a first inline inspection recipe. The capture rate at zero offset 508 was 23%, which was unacceptably low for the fabrication area. The fabrication area adjusted the inline inspection parameters to produce plot 504, which had a first capture rate 510 of 63%. Although the first capture rate is acceptably high, it does not provide an indication of the quality of the inline inspection process.

For example, plot 506 shows the capture rate versus offset that would be expected for a noisy inline inspection process. Although the first capture rate is drawn to be the same as for plot 504, the capture rate versus offset for plot 506 remains higher than for plot 504 because too many non-killer defects are being captured by the inline inspection process. As the bounding boxes are offset and the capture rates recalculated, non-killer defects contribute to the offset capture rates.

The bounding boxes were about 500 microns high and extended from one edge to the opposite edge of the FPGA. If only killer defects were identified by the inline inspection process, by the time the bounding boxes are moved one dimension away (i.e., 500 microns), then a very low capture rate is expected, and this is what is seen at ±500 microns 512, 514. The value at +500 microns for the first inline inspection recipe (plot 502) was 7%, and for the second inline inspection recipe (plot 504) was 8%. The capture rate might not go to zero if there is a second killer defect within 500 microns of the original bounding box, for example. Similarly, the inline inspection process probably captures at least some non-killer metal pattern defects that would fall into the offset bounding boxes.

Valuable information regarding the validity of the inline inspection process for capturing killer defects is obtained for offsets less than a dimension of the original bounding box (compare plots 504 and 506 between 500 microns offset and 0 offset), and embodiments offset bounding boxes less than a full box dimension. For example, points 516 and 518 occur at 250 microns offset for plots 504 and 506, and the drop from the zero-offset capture rate for point 516 on plot 504 is significantly more than for point 518. However, offsetting the bounding box by a dimension of the bounding box ensures that the metal pattern defect used to calculate the first capture rate will be outside of the offset bounding box used to calculate the second capture rate. Of course, another metal pattern defect might fall within the offset bounding box, which spreads out the capture rate (see plot 506).

In a particular embodiment, the capture rate at zero offset (first capture rate) is a first value (e.g., 63% for plot 504 or 23% for plot 502). The capture rate at an offset (offset capture rate or second capture rate) is less than one-half the first capture rate. The second capture rate occurring for any offset less than or equal to a dimension of the bounding box along the direction of offset (e.g., less than 31.5% for plot 504 occurring anywhere up to 500 microns 512 or minus 500 microns 514). In this example, the offset capture rate dropped to 8% at 500 microns offset and to 7% at minus 500 microns offset, which validates the inline inspection recipe for capturing killer defects. In the example of plot 502, the capture rates at the 500 micron points 512, 514 drop to 7% and 5% for 500 microns and minus 500 microns, from a zero offset value 508 of 23%. Thus plot 502 illustrates an embodiment of the invention. However, the low capture rate (zero capture rate less than 40%) indicates that several killer defects were not captured by the inline inspection recipe associated with plot 502. In a further embodiment it is desirable that the first capture rate be greater than or equal to 40%. The combination of a high first capture rate and steep offset sensitivity validates the inline inspection recipe of plot 504. Thus, in some embodiments, the inline inspection recipe is validated and not adjusted if the offset or second capture rate is less than or equal to about one-half the first capture rate, or if the offset or second capture rate is less than or equal to about 10%. On the other hand, the inline recipe may be adjusted if the second capture rate is greater than about one-half the first capture rate, or if the second capture rate is greater than about 10%. Other absolute and relative capture rates may be used for other embodiments, for example in different technology nodes.

Figure 6:
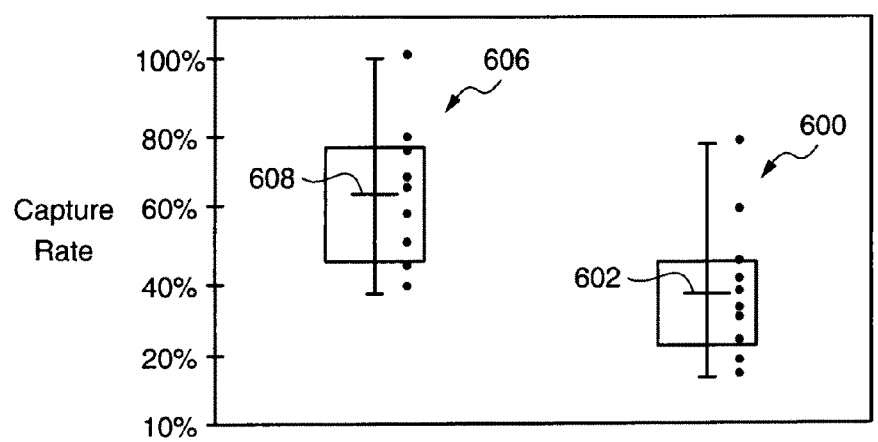
FIG. 6 is a diagram illustrating improved metal pattern defect capture rates according to an embodiment.

FIG. 6 is a diagram illustrating improved metal pattern defect capture rates according to an embodiment. A method of the invention substantially in accordance with the method described with reference to FIG. 4 was used to adjust the parameters of an inline inspection of the M8 patterned metal layer in an FPGA having eleven patterned metal layers. The first data set 600 shows the capture rate of killer defects captured using an initial inspection recipe. The average capture rate 602 for this data set 600 is about 0.34 (34% of the metal pattern defects captured with the inline inspection matched electrical defects). The fabrication facility adjusted the inline inspection recipe to improve the capture rate shown in a second data set 606 by increasing the sensitivity of the inspection process. The second data set 606 has a second average capture rate of 0.62. This indicates that the new inline inspection process (recipe) is better at capturing defects. However, simply increasing the sensitivity of an inline inspection process can also capture false (i.e., non-killer) defects. The inline inspection recipe was also adjusted to filter out defects arising from minor scratches. A technique substantially in accordance with FIG. 4 was used to verify that the inline inspection recipe was valid for capturing killer defects.

Offsetting bounding boxes and comparing capture rates of metal pattern defects and electrical test failures helps identify root causes of metal pattern (BEOL) failures. Test vectors designed to identify electrical defects in a selected patterned metal layer focuses physical failure analysis efforts to the selected patterned metal layer, which reduces the time and effort required to perform the failure analysis. Techniques according to embodiments help wafer fabrication lines evaluate BEOL inspection processes by providing quick feedback whether most of the killer defects can be captured in the BEOL inspection. Identification of the sources of killer defects is facilitated, and prioritization of yield improvement and defect reduction efforts is facilitated.

While the present invention has been described in connection with specific embodiments, variations of these embodiments will be obvious to those of ordinary skill in the art. For example, although specific embodiments are described in terms of patterned metal layers in an FPGA, alternative embodiments apply to other types of ICs and other types of patterned layers or structures. Therefore, the spirit and scope of the appended claims should not be limited to the foregoing description.

The invention claimed is:

1. A method of evaluating an inline inspection recipe comprising:

setting up a first inline inspection process of a patterned metal layer on a wafer according to first inline inspection parameters;

inspecting the patterned metal layer to capture metal pattern defect data;

processing the wafer to produce integrated circuits for electrical test, each of the integrated circuits being essentially identical;

applying a test vector to the integrated circuits to capture electrical failures for a plurality of failed integrated circuits;

calculating a bounding box for the plurality of failed integrated circuits in accordance with the test vector;

mapping metal pattern defect data for each of the plurality of failed integrated circuits to the bounding box;

calculating a first capture rate;

wherein the first capture rate is calculated as a function of a total number of those of the failed integrated circuits for which the metal pattern defect data maps to the bounding box, and of a total number of the failed integrated circuits;

shifting the bounding box for each of the plurality of failed integrated circuits to provide an offset bounding box for each of the plurality of failed integrated circuits;

mapping metal pattern defect data to the offset bounding box for each of the plurality of failed integrated circuits;

calculating a second capture rate;

wherein the second capture rate is calculated as a function of a total number of those of the failed integrated circuits for which the metal pattern defect data maps to the offset bounding box, and a total number of the failed integrated circuits;

comparing the first capture rate to the second capture rate to produce a difference; and adjusting the inline inspection recipe according to the difference to improve capture of killer defects.

2. The method of claim 1 further comprising applying a second test vector to the integrated circuits and calculating a second bounding box for the integrated circuits in accordance with the second test vector.

3. The method of claim 1 wherein the bounding box has a dimension that is parallel to an edge of an integrated circuit of the integrated circuits, and
wherein the shifting the bounding boxes comprises shifting the bounding box in a direction that is parallel to the edge by at least the dimension.

4. The method of claim 1 wherein the integrated circuits are field-programmable gate arrays ("FPGAs"), and the bounding box extends from a first edge of an FPGA to an opposite edge of the FPGA.

5. The method of claim 4 wherein the bounding box has a dimension along the first edge, and the dimension is equivalent to not more than five configurable logic blocks of the FPGA.

6. The method of claim 5 wherein the shifting the bounding box comprises shifting the bounding box at least the dimension in a direction parallel to the first edge to produce the offset bounding box, and
wherein, if the second capture rate is greater than one half the first capture rate, the inline inspection recipe is adjusted, and if the second capture rate is less than or equal to one half the first capture rate, the inline inspection recipe is not adjusted.

7. The method of claim 5 wherein the shifting the bounding box comprises shifting the bounding box at least the dimension in a direction parallel to the first edge to produce the offset bounding box, and
wherein, if the second capture rate is less than or equal to 10%, the inline inspection recipe is not adjusted.

8. The method of claim 7 wherein the first capture rate is greater than 40%.

9. The method of claim 5 wherein the dimension is equivalent to three configurable logic blocks of the FPGA.

10. The method of claim 1 wherein the integrated circuits are field-programmable gate arrays ("FPGAs") and the test vector is routed through a selected patterned metal layer of the FPGAs.

11. The method of claim 10 wherein the FPGAs have at least six patterned metal layers and the selected patterned metal layer is above a fifth patterned metal layer.

12. The method of claim 1 wherein, if the second capture rate is greater than one half the first capture rate, the inline inspection recipe is adjusted, and if the second capture rate is less than or equal to one half the first capture rate, the inline inspection recipe is not adjusted.

13. The method of claim 1 wherein, if the difference is at least one half of the first capture rate the inline inspection recipe is not adjusted and if the difference is less than one half of the first capture rate the inline inspection recipe is adjusted.

14. The method of claim 1 wherein the inline inspection recipe is not adjusted if the second capture rate is less than 10%.

15. A method of evaluating an inline inspection recipe comprising:
inspecting a patterned metal layer of partially fabricated integrated circuits (ICs) on a wafer according to a first set of inspection parameters to capture metal pattern defect data;
processing the wafer to produce a plurality of ICs from the partially fabricated ICs;
designing a test vector to capture electrical failures in the patterned metal layer;
applying the test vector to the plurality of ICs to detect an electrical failure on the plurality of ICs;
calculating a bounding box on the plurality of ICs according to the test vector, the electrical failure being within the bounding box;
mapping the metal pattern defect data for the metal layer to the bounding box;
calculating a first capture rate;
wherein the first capture rate is calculated as a function of a total number of the plurality of ICs for which the metal pattern defect data maps to the bounding box, and a total number of the plurality of ICs in which the electrical failure was detected;
shifting the bounding box to define a shifted bounding box on the IC;
mapping metal pattern defect data for the metal layer to the shifted bounding box;
calculating a second capture rate;
wherein the second capture rate is calculated as a function of a total number of the plurality of ICs for which the metal pattern defect data maps to the shifted bounding box, and a total number of the plurality of ICs in which the electrical failure was detected; and
comparing the first capture rate to the second capture rate.

16. The method of claim 15 wherein the patterned metal layer is above a fifth patterned metal layer of the IC.

17. The method of claim 15 wherein the bounding box extends from a first edge of each of the plurality of ICs to a second edge of each of the plurality of ICs opposite the first edge along a first axis, and wherein the bounding box has a dimension along a second axis perpendicular to the first axis, the dimension spanning not more than five configurable logic blocks of each of the plurality of ICs.

18. The method of claim 15 further comprising,
designing a second test vector to capture electrical failures in the patterned metal layer;
applying the second test vector to the plurality of ICs to detect a second electrical failure;
calculating a second bounding box on the plurality of ICs according to the second test vector, the second electrical failure being within the second bounding box;
mapping metal pattern defect data for the metal layer to the second bounding box;
calculating a third capture rate;
wherein the third capture rate is calculated as a function of a total number of the plurality of ICs for which the metal pattern defect data maps to the second bounding box, and a total number of the plurality of ICs in which the second electrical failure was detected;
shifting the second bounding box to define a second shifted bounding box on the plurality of ICs;
mapping metal pattern defect data for the metal layer to the second shifted bounding box;
calculating a fourth capture rate;
wherein the fourth capture rate is calculated as a function of a total number of the plurality of ICs for which the metal pattern defect data maps to the second shifted bounding box, and a total number of the plurality of ICs in which the second electrical failure was detected; and
comparing the third capture rate to the fourth capture rate.

19. The method of claim 18 wherein the second shifted bounding box partially overlaps the second bounding box.

* * * * *